(12) United States Patent
Barak

(10) Patent No.: US 11,099,142 B2
(45) Date of Patent: Aug. 24, 2021

(54) X-RAY BASED MEASUREMENTS IN PATTERNED STRUCTURE

(71) Applicant: Nova Measuring Instruments Ltd., Rehovot (IL)

(72) Inventor: Gilad Barak, Rehovot (IL)

(73) Assignee: NOVA MEASURING INSTRUMENTS LTD., Rehovot (IL)

( * ) Notice: Subject to any disclaimer, the term of this patent is extended or adjusted under 35 U.S.C. 154(b) by 57 days.

(21) Appl. No.: 16/037,161

(22) Filed: Jul. 17, 2018

(65) Prior Publication Data
US 2019/0033236 A1 Jan. 31, 2019

(30) Foreign Application Priority Data

Jul. 19, 2017 (IL) .......................................... 253578

(51) Int. Cl.
| | |
|---|---|
| *G01N 23/2055* | (2018.01) |
| *H01L 21/66* | (2006.01) |
| *G06T 7/00* | (2017.01) |
| *G06T 5/00* | (2006.01) |
| *G01N 23/201* | (2018.01) |

(Continued)

(52) U.S. Cl.
CPC ......... *G01N 23/2055* (2013.01); *G01N 23/20* (2013.01); *G01N 23/201* (2013.01); *G06T 5/002* (2013.01); *G06T 7/0004* (2013.01); *H01L 22/12* (2013.01); *G01N 23/207* (2013.01); *G01N 2223/401* (2013.01); *G01N 2223/6116* (2013.01); *G06T 2207/10116* (2013.01); *G06T 2207/20224* (2013.01); *G06T 2207/30148* (2013.01)

(58) Field of Classification Search
CPC ............ G01N 23/2055; G01N 23/201; G01N 2223/401; G01N 2223/6116; G06T 5/002; G06T 7/0004; G06T 2207/10116; G06T 2207/20224; G06T 2207/30148; H01L 22/12
See application file for complete search history.

(56) References Cited

U.S. PATENT DOCUMENTS 9,588,066 B2    3/2017  Pois et al.
2003/0215057 A1*  11/2003  Trotter .................. G06T 11/005
                                          378/89

(Continued)

*Primary Examiner* — Zhitong Chen
(74) *Attorney, Agent, or Firm* — Reches Patent

(57) ABSTRACT

A method and system are presented for use in X-ray based measurements on patterned structures. The method comprises: processing data indicative of measured signals corresponding to detected radiation response of a patterned structure to incident X-ray radiation, and subtracting from said data an effective measured signals substantially free of background noise, said effective measured signals being formed of radiation components of reflected diffraction orders such that model based interpretation of the effective measured signals enables determination of one or more parameters of the patterned structure, wherein said processing comprises: analyzing the measured signals and extracting therefrom a background signal corresponding to the background noise; and applying a filtering procedure to the measured signals to subtract therefrom signal corresponding to the background signal, resulting in the effective measured signal.

20 Claims, 6 Drawing Sheets
(3 of 6 Drawing Sheet(s) Filed in Color)

(51) Int. Cl.
    *G01N 23/20*     (2018.01)
    *G01N 23/207*     (2018.01)

(56) References Cited

U.S. PATENT DOCUMENTS

| | | | |
|---|---|---|---|
| 2006/0023836 A1* | 2/2006 | Berman | G01N 23/203 378/70 |
| 2007/0274447 A1* | 11/2007 | Mazor | G01N 23/201 378/70 |
| 2015/0110249 A1* | 4/2015 | Bakeman | G01N 23/201 378/87 |
| 2015/0204802 A1* | 7/2015 | Pois | G01N 23/201 378/86 |
| 2015/0233804 A1* | 8/2015 | Meisberger | G01N 1/42 378/53 |
| 2016/0139065 A1 | 5/2016 | Barak et al. | |
| 2016/0363872 A1 | 12/2016 | Sendelbach et al. | |
| 2017/0018069 A1 | 1/2017 | Vaid et al. | |

\* cited by examiner (GENERAL ART)

X-RAY BASED MEASUREMENTS IN PATTERNED STRUCTURE

TECHNOLOGICAL FIELD AND BACKGROUND

The present invention is in the field of measurements in patterned structures, such as semiconductor wafers, and relates to a measurement system and method utilizing X-ray measurement techniques.

Manufacture of semiconductor structures requires highly precise and accurate metrology techniques and instruments. This requirement becomes more crucial since with the progress in semiconductor technology, shrinking device dimensions has become an increasingly complex task. Complementing metrology tools, allowing similar improvements in measurement capabilities, are critical for the continual process of this development. Most critical are metrology solutions allowing dimensional characterization of the measured structure. Techniques such as Critical-Dimensions Scanning Electron Microscopy (CD-SEM) and Optical Critical Dimensions (OCD) are heavily utilized in the fab, at various steps of the fabrication process as well as during research and development.

As device dimensions shrink and sensitivity to process details becomes increasingly crucial, the ability to access more diverse and independent physical properties of the sample becomes of paramount importance. These challenges require the introduction of disruptive metrology techniques, based on additional physical principles. One such technology is X-ray scatterometry (XRS), where scattered signal from monochromatic X-ray is analyzed for dimensional characterization. Examples for such approach are Critical Dimension Small-Angle X-ray Scatterometry (CD-SAXS) also known as Transmission SAXS (T-SAXS), Grazing-incidence Small-Angle X-ray Scatterometry (GI-SAXS), as well as X-ray Diffraction (XRD) or High-Resolution X-ray Diffraction (HR-XRD) and Reciprocal Space Mapping (RSM) techniques.

For example, US 2017/0018069, US 2016/0139065 and US 20160363872, all assigned to the assignee of the present application, describe various measurement techniques based X-ray techniques. US 2017/0018069 describes a hybrid metrology technique for use in measuring parameter(s) of interest of a structure. According to this technique, first and second measured data of different types measured on the same structure are provided, where one of these measured data may include X-ray measured data, and these first and second measured data are processed to determine first and second parameters to optimized model data for interpreting the first and/or second measured data. US 2016/0139065 describes a measurement technique for measuring parameter (s) of a sample utilizing XRD or HR-XRD measurements. This technique provides for optimizing XRD measurements by information about the geometrical parameters of the sample's structure, e.g. pattern features, as well as vice versa: using the XRD measured data for optimizing/interpreting a different geometry-related measurement, thereby enabling determination of both the sample geometry and materials properties/compositions. The geometry-related data may be provided by a different measurement technique, such as optical measurements, e.g. Optical Critical Dimensions (OCD) measurements, CD-AFM, CD-SEM, as well as other X-ray technique. US 2016/0363872 describes a method and system for use in planning metrology measurements, utilizing various combinations of measurements by a tool under test (TuT) and a reference measurement system (RMS), where X-ray based tools may be used as reference/CD measurement, such as XRD, X-ray photoelectron spectroscopy (XPS), X-ray Raman scattering (XRS).

U.S. Pat. No. 9,588,066 describes methods and systems for measuring periodic structures using multi-angle X-ray reflectance scatterometry (XRS). This technique involves impinging an incident X-ray beam on a sample having a periodic structure to generate a scattered X-ray beam, where the incident X-ray beam simultaneously provides a plurality of incident angles and a plurality of azimuthal angles.

General Description

There is a need in the art for a novel measurement technique for measurements on patterned structures, utilizing x-ray scatterometry, to efficiently remove such effects as roughness and background noise in measured signals, to thereby significantly improve the signal-to-noise of the measurement technique.

The roughness and background noise related effects are associated with the following: The known X-ray techniques use a significantly smaller wavelength (from less than 1 Å up to a few nanometers) than standard optical techniques. As the dimensions of features in a patterned structure (e.g. semiconductor wafer) are themselves characteristically in this range, the measured signal can be extremely sensitive to the measured structure geometry. In order to interpret the information about a structure from the X-ray measurement, some means of relating the measured signal with dimensional characteristics is needed. One example would be a similar approach to that used for OCD, in which the measurements are model-based: a model is used to calculate the expected (theoretical) data from some assumed structure and compared to the measured data. The dimensions of the assumed structure are then modified as the model parameters until reaching optimal agreement (best fit) between the calculated/theoretical and measured signals. Other known approaches are also based on the ability to relate an X-ray scatterometry signal with some specific measured geometry.

However, X-ray scatterometry can suffer from a considerable additional difficulty in such interpretation process. This is because the measured signal is strongly affected by some factors which are not directly related to the nominal structure being measured and which act to confound the interpretation process. These factors include the effects of roughness and background noise.

More specifically, the roughness effect is associated with small ununiformed deviation of the structure from its intended geometry, which is an inherent ingredient in any fabrication process. In this connection, reference is made to FIG. 1, showing a simple etched grating line (pattern feature) with the typical unsmooth shape, i.e. roughness structure on the nanometric scale. For optical scatterometry methods, where the wavelength is typically hundreds of nanometers, these small deviations of the pattern features from the nominal structure typically averaged out, leading to a minor effect on the measurement. However, for X-ray methods, the wavelength can be of similar length scale as the roughness, leading to a greatly amplified effect on the measurement. Consequently, disregarding the effect of roughness could lead to substantial errors in the measured data interpretation process.

As for the background noise, this is associated with such common characteristic of X-ray measurement techniques as a weak collected signal, which increases sensitivity to underlying noise sources. The reason for the typical signal weakness is a combination of illumination source characteristics, which typically provides orders of magnitude less photon flux than is available for optical metrology, and the reduced cross-section with the sample. As a result, background noise factors can lead to non-negligible errors in the measurement, degrading the interpretation accuracy.

Such contributions/effects of roughness and background noise are characterized by smooth-varying intensity distributions added onto the X-ray signal being measured, contrary to the main diffracted signal which typically includes sharp variations in reflected intensity. The present invention provides a novel approach for X-ray scatterometry based on a specific measurement mode and data interpretation approach, enabling to efficiently remove the effects of roughness and background noise.

For simplicity, in the description below, both of these factors (effects of roughness and background noise) are referred to as "background contributions". Also, in the description below, such effects/features as specular reflection as well as diffracted orders from the periodic structure are referred to as "ordinary reflection".

The invention provides for simple and effective technique enabling to obtain effective measured signals substantially free of background contributions. In some embodiments, this is implemented by processing measured data collected from a patterned structure which has a certain angular distribution (image span). The processing comprises identifying a part in the measured data (reflection/response from the patterned structure) corresponding to diffraction orders, and removing that part from the measured signal. As indicated above, the diffraction orders related signal can be identified as including sharp variations of the intensity, as compared to relatively smooth-varying intensity. Then, the remaining part of the measured signal/data (i.e. background only signal) undergoes further processing in order to determine image data representing the background across the entire image span. Thereafter, the so-determined background signal is subtracted from the original measured signal, resulting in a clean image of the reflection/diffraction orders. This data can then be used/interpreted for determining various parameters/information of the patterned structure.

The above technique can be further optimized by selection of an optimal measurement scheme, namely selection (for a given wavelength of illumination) of an angular span of incident radiation and its azimuth orientation with respect to the pattern on the structure being measured. The selected measurement scheme is such that a required angular span of the reflection orders (image span) is obtained, namely such that radiation components of different reflection orders interact with different regions on the radiation sensitive surface (pixel matrix) of the detector which are substantially non-overlapping, i.e. spatially separated from one another by gap(s).

Thus, the present invention in its one aspect, provides a method for use in X-ray based measurements on patterned structures, the method comprising: processing data indicative of measured signals corresponding to detected radiation response of a patterned structure to incident X-ray radiation, and subtracting from said data an effective measured signals substantially free of background noise, said effective measured signals being formed of radiation components of reflected diffraction orders such that model based interpretation of the effective measured signals enables determination of one or more parameters of the patterned structure, wherein said processing comprises: analyzing the measured signals and extracting therefrom a background signal corresponding to the background noise; and applying a filtering procedure to the measured signals to subtract therefrom signal corresponding to the background signal, resulting in the effective measured signal.

The analysis of the measured signals and extraction of the background signal may comprise: processing the measured signals to filter out signals corresponding to radiation components of reflected diffraction orders and extract a background signature indicative of the background noise; and applying a fitting procedure to the background signature to obtain the background signal.

The method may further include image processing of the background signal to obtain a corrected image representation of the background signal, being then used as the signal corresponding to the background signal to be subtracted from the measured signals.

Preferably, the effective measured signals contained in the measured signals to be processed correspond to a predetermined angular span of the reflection orders in the radiation response of the structure, such that the radiation components of different reflection orders interact with different spatially separated regions on a radiation sensitive surface of a detector.

The method can further include the stage of providing data indicative of an optimized measurement scheme to be used in collection of said measured signals, wherein the optimized measurement scheme provides that the measured signals comprise the effective measured signals corresponding to the angular span as described above. More specifically, the optimized measurement scheme comprises a selected angular span of illuminating radiation and azimuth orientation with respect to an orientation of features of the pattern on the structure, such that using said selected angular span of illuminating radiation provides the required angular span of reflection orders in radiation response of the structure to the illuminating radiation.

The method may include one or more measurement sessions performed on the patterned structure using the optimized measurement scheme and generating the data indicative of the measured signals.

The method may further include model based processing (fitting procedure) of the effective measured signals extracted as described above, and determining one or more parameters of the patterned structure.

The invention, in its another aspect, provides a control unit comprising: data input and output utilities, a memory utility, and a processor utility, which is configured and operable to execute the above-described method, to process the measured signals and determine the effective measured signals, and generate data indicative thereof for further interpretation and determination of one or more parameters of the patterned structure.

The control unit may also comprise a measurement scheme controller, which is configured and operable to analyze input data indicative of a pattern on the structure being measured, and generate the optimized measurement scheme data indicative of selected angular span of illuminating radiation and azimuth orientation with respect to the pattern to provide the angular span of reflection orders in the radiation response of the structure, such that radiation components of different reflection orders interact with different spatially separated regions on a radiation sensitive surface of a detector, thereby enabling subtraction of the effective measured signals substantially free of background noise from the detected measured signals.

In yet further aspect, the invention provides a measurement system for use in X-ray based measurements on patterned structures. The system comprises: an illumination unit configured and operable to define an illumination channel for directing illuminating radiation onto a measurement plane for interacting with a structure being measured; an angular span controller located in the illumination channel; a detection unit for detecting radiation response from the structure propagating along a collection channel; and a control unit configured for data communication with the illumination and detection units, the control unit comprising a measurement scheme controller, which is configured and operable to analyze data indicative of a pattern on the structure being measured, and generate measurement scheme data indicative of selected angular span of illuminating radiation and azimuth orientation with respect to the pattern to provide an angular span of reflection orders in the radiation response of the structure such that radiation components of different reflection orders interact with different spatially separated regions on a radiation sensitive surface of the detector, thereby enabling subtraction of an effective measured signals substantially free of background noise.

The angular span controller may comprise an aperture assembly of controllably varying dimension and/or shape to enable selection of an aperture dimension and/or shape according to the selected measurement scheme.

BRIEF DESCRIPTION OF THE DRAWINGS

The patent or application file contains at least one drawing executed in color. Copies of this patent or patent application publication with color drawings will be provided by the Office upon request and payment of the necessary fee.

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1:
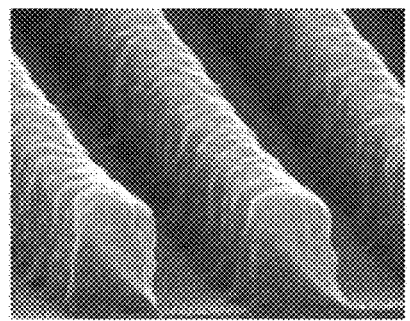
FIG. 1 is a picture of the portion of the surface of a patterned structure illustrating typical surface roughness on the nanometric scale.

The present invention relates to measurements of periodic patterned structures, such as semiconductor wafers, in which the pattern typically includes some periodicity of unit cells along one or two directions. Each unit cell includes a pattern of spaced-apart regions of different optical properties (e.g. lines and spaces). The invention technique is aimed at solving the above-described problems of X-ray measurements associated with effects of roughness and background noise. FIG. 1 exemplifies the structure's surface having surface roughness on the nanometric scale.

Figure 2:
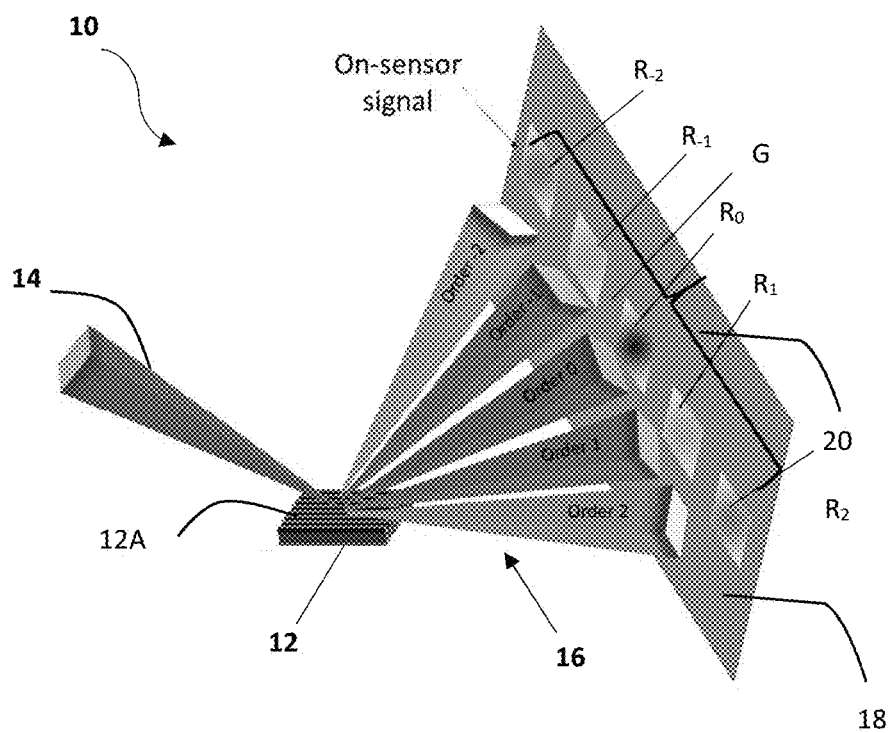
FIG. 2 schematically illustrates the principles of X-ray based measurement scheme according to the present invention.

Reference is made to FIG. 2 schematically illustrating the principles of X-ray based (such as GI-SAXS, as well as XRS and T-SAXS) measurement scheme 10 of the present invention. As shown in the figure, a sample 12 is irradiated by X-ray radiation including a range of illumination angles within a solid angle 14 of incident radiation, and such X-ray interaction with the sample 12 causes a radiation response 16 of the sample in the form of reflection/diffraction orders including zero-order diffraction and high diffraction orders. The radiation response 16 is detected by a 2D sensor matrix 18 having a radiation sensitive surface, where different diffraction orders are detected by different regions (sensor elements/pixels or groups of sensor elements/pixels) of the sensor matrix 18. Analysis of these diffraction orders allows characterization of the measured structure 12.

Thus, the X-ray scatterometry in general involves three main functional parts: illumination, the patterned structure being measured, and detection of the radiation response. The illumination mode/configuration provides for directing a beam of monochromatic X-ray radiation 14 towards a sample/structure 12. This beam 14 can be collimated (as used in T-SAXS), but for a most general case, it has an angular span as shown in FIG. 2. The illuminating beam 14 is focused onto a structure (for a collimated beam no focus is needed), and is reflected/returned from the structure. For metrology purposes, the measured structure 12 has a patterned surface 12A, where the pattern typically includes a periodic set of features, i.e. the elements under study (i.e. an array of transistors, memory cells, etc.). Upon reflection from this structure, the X-ray is scattered both in the specular direction (zero-order reflection/diffraction), and in the directions corresponding to high reflection/diffraction orders from the structure. The reflected radiation 16 is detected/measured by the 2D matrix 18 of the detector, creating an image 20 of reflection per angle of incidence and azimuth of the illumination 14.

Different SAXS implementations involve different sequence of data acquisition (for example, T-SAXS involves rotating the sample and sequentially acquiring a set of images, from which the full 2D dependence of the reflected signal is deduced). For simplicity, in the description below a measurement sequence is referred to as representative of GI-SAXS, in which multiple angles of incidence are probed in each measured image. It should, however, be understood that the invention is not limited to any specific type X-ray measurement technique, and therefore the invention should be interpreted broadly in this respect.

The present invention is based on the fact that the reflected diffraction orders from the structure being illuminated by angular span can be separated from each other, leaving regions in the image where only non-nominal signals arrive The present invention is based on the fact that the reflected diffraction orders from the structure being illuminated by angular span can be separated from each other. This means that the angular span of adjacent diffraction orders is smaller than their separation. This way, between adjacent diffraction orders there is a region where nominally no radiation is expected, and only non-nominal signal is measured. Examples for such 'non-nominal' signal sources would be stray light, roughness-related reflections, reflections from defects/pattern irregularities, etc. The signals obtained in these regions are thus entirely related to 'background' contributions, which in many cases is highly desired to remove. Such separation can be controlled by appropriate choice of the illumination angular span, which in selected in accordance with the structure being measured and its azimuthal orientation. This will be described more specifically further below. Once the diffraction orders are separated, it is possible to isolate the contribution from direct reflections, i.e. reflections associated with diffraction orders from the periodic pattern, and background contribution.

As described above, the background reflection components (being background noise) are characterized by smooth-varying intensity distributions added onto the X-ray signal being measured, contrary to the main diffracted signal which typically includes sharp variations in reflected intensity. This allows an algorithmic approach for deducing the contribution from these components at the regions where ordinary reflection resides. Once this contribution is obtained, it can be subtracted from the ordinary reflection regions, allowing straightforward analysis and interpretation of the measured signals.

Figure 3:
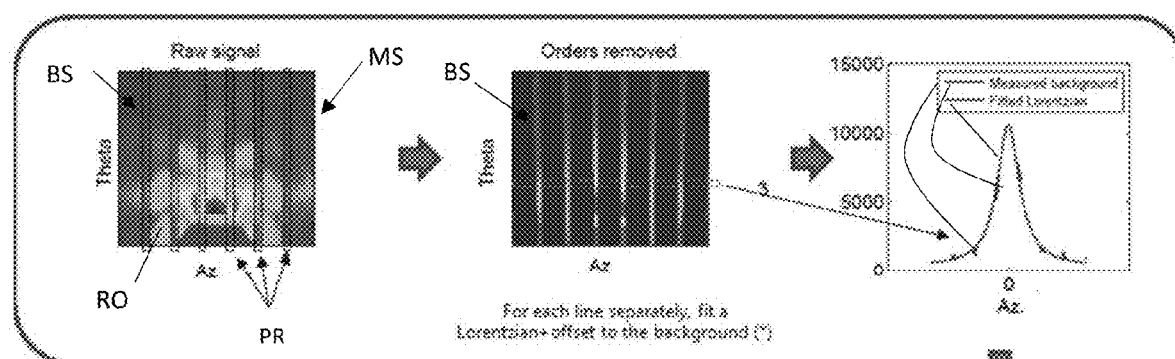
FIGS. 3A-3E schematically illustrate an example of data processing and analysis according to the technique of the invention.

Reference is made to FIGS. 3A-3E, schematically exemplifying the analysis methodology of the invention. FIG. 3A exemplifies a detected/measured signal MS (raw signals/image) as a function of illumination angles Theta and Azimuth of illumination. The measured signal MS is formed by reflected orders RO and background signature BS associated with the reflection from the pattern regions PR. These regions of the pattern features PR, creating the background signature BS (background noise) are to be isolated. As will be described below, measurement is set so that diffraction orders RO are spatially separated on the radiation sensitive surface (2D matrix) of the detector. As shown in FIG. 3B, once the diffraction orders RO are removed, background-only signal BS can be identified. A dedicated algorithm van be used to expand the background signal. In this example, a Lorentzian fit is used (FIG. 3C). The background signal BS then undergoes interpolation\extrapolation, resulting in an image representing the background across the entire image span, as shown in FIG. 3D. The background signal BS can then be subtracted from the measured signal MS, providing a clean image of the reflection orders RO.

Preferably, this approach utilizes a correct choice of the illumination angular range 14. This choice is based on the requirement of having different diffraction orders spatially separated on the 2D sensing matrix of the detector. In the present example, the measurement setup schematically illustrated in FIG. 2 is considered as reference, and the required illumination angular range suitable for this case is analyzed. It should be understood that a similar analysis is straightforward for other geometries.

The following is the description of a derivation for the angular separation between diffraction orders. This enables to set the allowed illumination angular range such that no overlap exists between the different reflection orders.

Figure 4:
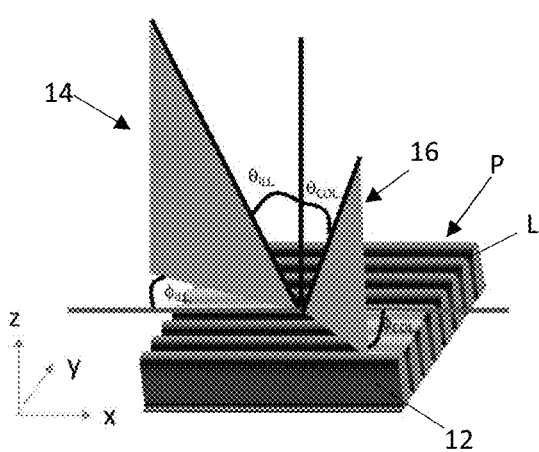
FIG. 4 schematically illustrates the radiation propagation scheme according to the measurement scheme of the invention.

In this connection, reference is made to FIG. 4 schematically illustrating the radiation propagation scheme with respect to the pattern orientation on the sample. As shown in this example, the pattern P is configured as a grating formed by parallel features (lines) L extending along X-axis (defining the grating axis) and arranged in a spaced-apart relationship along Y-axis. Illuminating radiation 14 (angular span) is incident upon the patterned surface of the sample 12 at angle $\theta_{ILL}$ (with respect to the normal to the sample), and azimuthal angle $\phi_{ILL}$. In this example, azimuth is defined with respect to the grating axis, but this is not a necessary restriction.

Considering radiation of wavelength $\lambda$ and wavenumber $k_0 = 2\pi/\lambda$, the transverse wavenumber $k_{ILL}$ (i.e. wavenumber on the sample plane) is given by $$k_{ILL} = k_0(\sin(\theta_{ILL})\cos(\phi_{ILL}), \sin(\theta_{ILL})\sin(\phi_{ILL}))$$

Interaction of the illuminating radiation 14 with the grating P results in a radiation response 16 formed by radiation reflected in a set of discrete directions, corresponding to the diffraction orders from the grating. Generally, although not specifically shown, the grating P can have periodicity of features L in two directions, with pitch $P_x$ in the x direction and $P_y$ in the y direction (either of which can be zero if periodicity exists only in one dimension). Diffraction orders will be denoted $(n_x, n_y)$ for the $n_x$ order arising from the periodicity in direction x and $n_y$ order arising from periodicity in the y direction.

The $(n_x, n_y)$ diffraction order will have transverse wavenumber given by:

$$k_{COL} = \left(k_0\sin(\theta_{ILL})\cos(\phi_{ILL}) + \frac{2\pi}{P_x}n_x, k_0\sin(\theta_{ILL})\sin(\phi_{ILL}) + \frac{2\pi}{P_y}n_y\right)$$

The reflection direction of this order is given by:

$$\phi_{COL} = \operatorname{atan}\left(\frac{k^y_{COL}}{k^x_{COL}}\right) = \operatorname{atan}\left(\frac{\sin(\theta_{ILL})\sin(\phi_{ILL}) + \frac{\lambda}{P_y}n_y}{\sin(\theta_{ILL})\cos(\phi_{ILL}) + \frac{\lambda}{P_x}n_x}\right), \text{ and}$$

$$\theta_{COL} = \operatorname{asin}\left(\frac{\frac{\lambda}{P_x}n_x}{\cos(\phi_{ILL})}\right).$$

By these relations, it is straightforward to relate any illumination angular span to the angular span of all reflected orders. Specifically, it is possible to check whether overlaps are expected between the reflected orders.

Turning back to FIGS. 1 and 4, the invention provides that, for a given wavelength $\lambda$ of illumination, the angular span $\theta_{ILL}$ of incident radiation 14 and its azimuth orientation $\phi_{ILL}$ with respect to the pattern P on the structure being measured, can be controlled/selected to provide a required angular span $\phi_{COL}$ of the reflection orders 16. This required angular span $\phi_{COL}$ of the reflection orders 16 is such that radiation components of different reflection orders interact with different regions R on radiation sensitive surface 18 of the detector spatially separated from one another by gap(s) G. It should be understood that the value(s) of G can also be controlled by the length of the collection channel.

Several approaches are possible to implement this limitation/selection of the illumination range of angular span. Some examples include the use is a single aperture with controllable dimensions placed in the optical path, or an interchangeable set of apertures placed in the optical path. These could be exchanged or modified according to the measured sample pitch. Further flexibility can be obtained by allowing different shapes of apertures. It should be noted that when the pattern on the measured structure is periodic in two directions, such approach can guarantee separation of high diffraction orders in both directions.

More generally, it is possible to implement such separation only on one subgroup of the reflection orders. For example, diffraction orders related to the grating pitch in one direction can be separated, while leaving orders related to the pitch in another direction overlapping. Although with this approach some of the background signal might not be removed, providing a degraded result, it may be easier to implement in practice and may be suitable/sufficient in some applications.

Figure 5A:
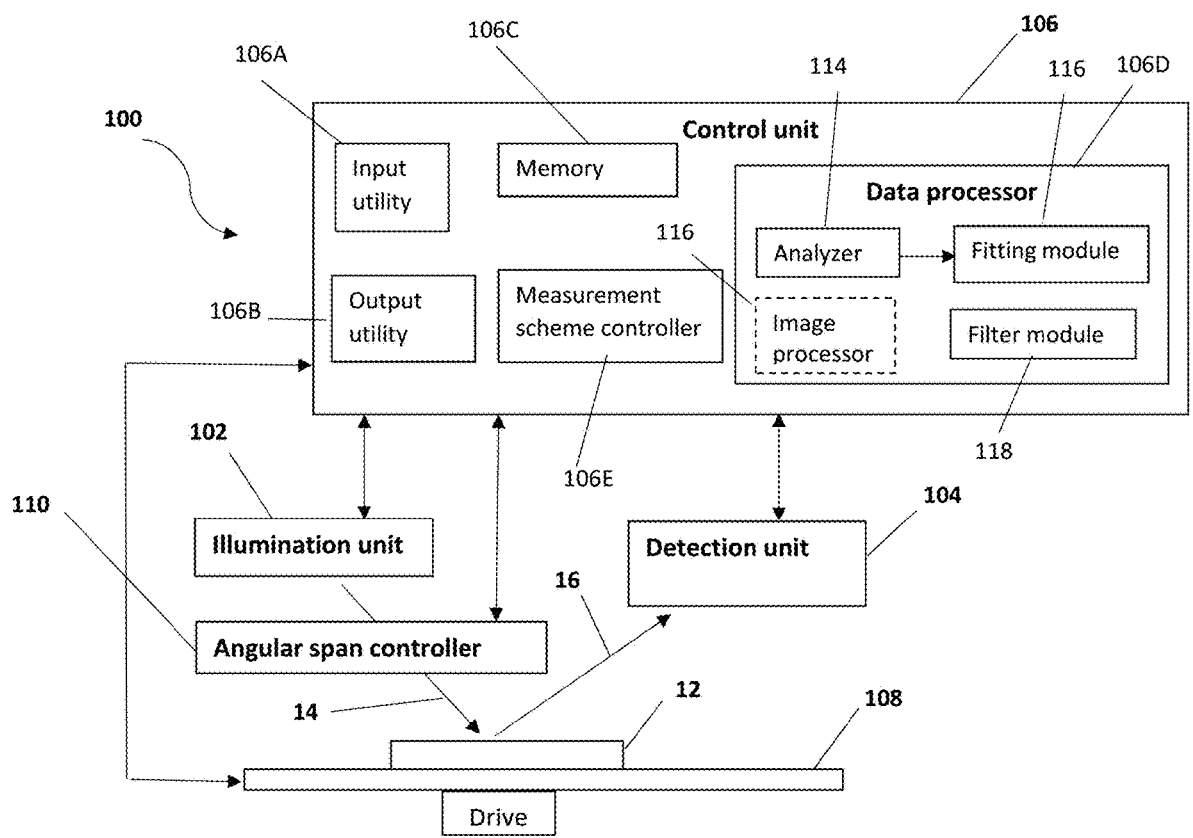
FIG. 5A is a block diagram of a measurement system of the invention for implementing the measurement scheme exemplified in FIG. 4.
Figure 5B:
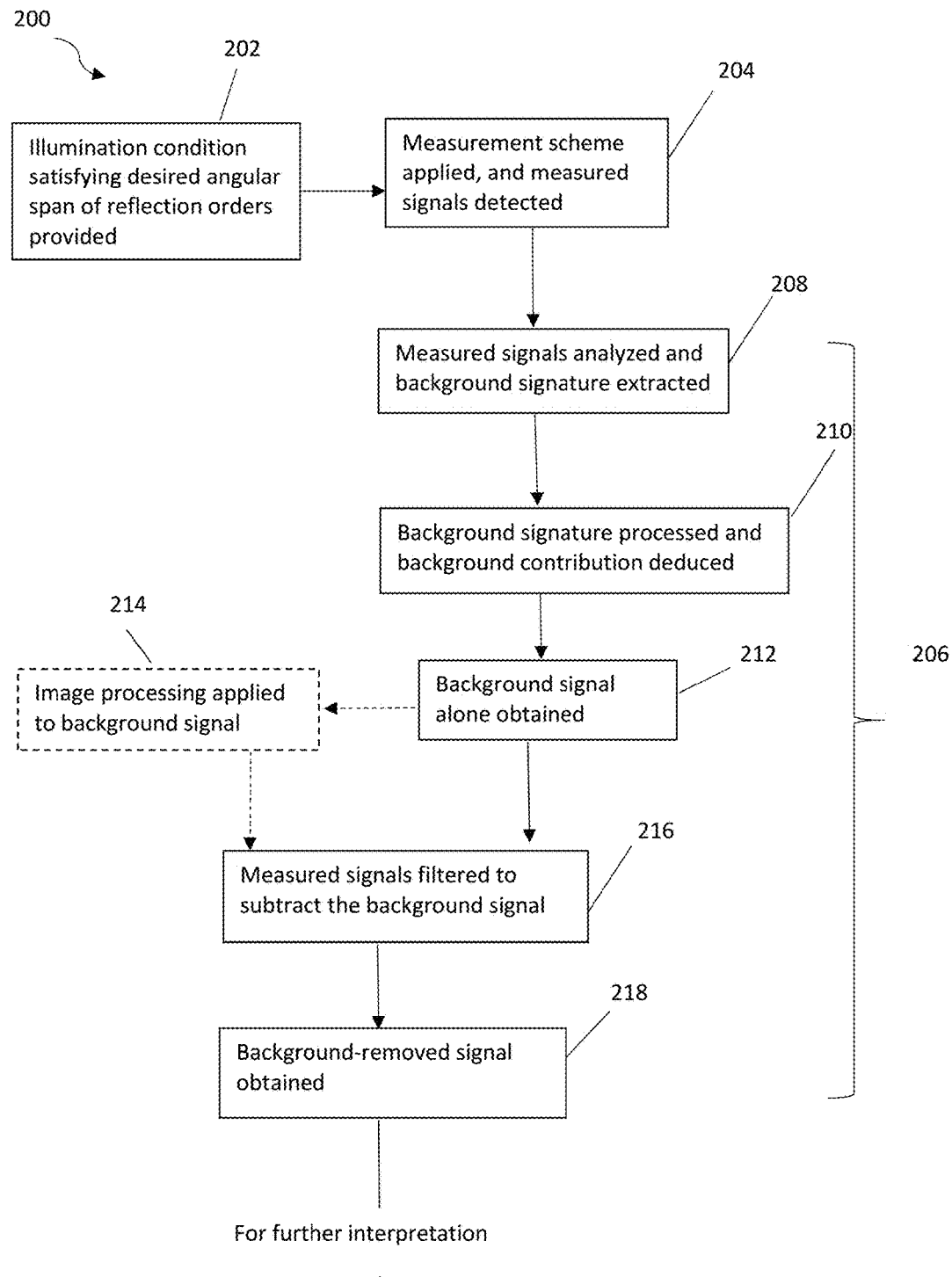
FIG. 5B is a flow diagram of the data analysis method of the invention.

Reference is now made to FIGS. 5A and 5B schematically illustrating a block diagram of a measurement system 100 of the invention (FIG. 5A) and a flow diagram 200 of a method of the invention (FIG. 5B). The system 100 includes an illumination unit 102 defining an illumination channel for directing illuminating radiation 14 onto a measurement plane (sample plane), a detection unit 104 for detecting radiation response from a sample 12 propagating along a collection channel, and a control unit 106 configured to be in data/signal communication with the illumination and detection units (via wires or wireless signal transmission using any known suitable communication techniques and protocols). Also provided in the system 100 is an angular span controller 110 located in the illumination channel.

The control unit 106 is configured as a computer system including inter alia such functional and structural utilities as input and output utilities 106A and 106B, memory utility 106C, and data processor 106D. The control unit 106 further includes a measurement scheme controller (a so-called orientation controller) 106E, which is configured to receive and analyze data indicative of a pattern P on the structure/sample 12 (e.g. pattern pitch along one or two axes) and its azimuthal orientation with respect to the illumination channel, and generate data indicative of an optimal choice for the illumination angular span for operating the angular span controller 110. It should be noted that the structure under measurements may be located on a stage/support 108 driven for rotation so as to adjust the pattern orientation with respect to the illumination channel, as the case may be. The angular span controller may be configured as described above, namely may include a single aperture with controllably varying dimensions and/or shapes, or an interchangeable set of apertures of different dimensions/shapes. This enable selection of an aperture shape according to the selected measurement scheme.

Thus, the orientation controller 106E operates the angular span controller 110 and possibly also the stage 108 (via its drive) to select the illumination angular span 14 such that the measured image is formed by distinct regions corresponding to the high reflection orders, with gaps between them, i.e. such that no overlap exists between different orders. Such an image is exemplified in FIG. 3A described above.

Once this situation is assured, i.e. the desired orientation is provided (step 202 in FIG. 5B), the following measurement scheme is performed in order to remove the effects of background signal/contribution. Measured signal MS is detected by the pixel matrix of the detection unit 104 which generates measured data indicative thereof (step 204) and coveys this data to the control unit 106 where it is processed by the data processor 106D (step 206). The data processor 106D includes an analyzer module 112 configured (preprogrammed) for filtering out signals corresponding to radiation components of reflected diffraction orders (presenting "active signals"), leaving only background signature (presenting "noise")—step 208. This is illustrated in FIG. 3B described above. Then, the background signature signals are interpolated (and extrapolated) by a fitting module 114 (step 210) to deduce the background contribution to the entire measured image or a selected part of it. To this end, the fitting module 114 utilizes some underlying functional shape/form for the background signal (e.g. approach shown in FIG. 3C according to which each angle of incidence is fitted separately by Lorentzian lineshape; or any other functional form, or a two-dimensional functional form, and using a fitting approach based on some theoretical model). This results in the background signal alone (step 212). The so-obtained image describing the background signal alone may optionally be further processed by any suitable image processor 116 to smooth and correct this image (optional step 214). The initial image (measured data) is then processed by a filter module 118 which operates to subtract the background signal/image (either being processed by image processor or not) from the initial image (step 216) resulting in the final, background-removed signal (step 218). This final signal presents the active/effective measured data that can be used for analysis and interpretation using any known suitable technique, e.g. model-based data interpretation.

Thus, the present invention provides a simple and effective technique for use in X-ray based scatterometry measurements on patterned structures. According to the invention, a measurement scheme is optimized to enable subtraction of background-noise free effective measured signal, which can then be interpreted to determine the structure parameters using any known suitable data interpretation approach.

I claim:

1. A method for use in X-ray based measurements on patterned structures, the method being carried out by a computer system and comprising:
    processing, by a processor utility of the computer system, data indicative of measured signals corresponding to detected radiation response of a patterned structure to incident X-ray radiation, wherein the measured signals comprises (a) an angular span of diffraction orders that were scattered from the patterned structure, and (b) background signals;
    deducing background signals within the angular span, based on background signals located outside the angular span; and
    applying a filtering procedure to the measured signals to subtract from measured signals within the angular span, the deduced background signals within the angular span to provide effective measured signals that are, within the angular span, substantially free of the background signals.

2. The method according to claim 1, wherein the deducing of the deduced background signals within the angular span comprises interpolating the background signals outside of the angular span.

3. The method according to claim 1, wherein the deducing of the deduced background signals within the angular span comprises extrapolating the background signals outside of the angular span.

4. The method according to claim 1 wherein the deducing of the deduced background signals within the angular span comprises expanding the background signals outside of the angular span.

5. The method according to claim 1, wherein different diffraction orders interact with different spatially separated regions on a radiation sensitive surface of a detector.

6. The method according to claim 5, wherein the deducing of the deduced background signals within the angular span comprises ignoring signals originating from the different spatially separated regions on the radiation sensitive surface of the detector.

7. The method according to claim 5 wherein the radiation sensitive surface comprises a two dimensional array of pixel.

8. The method according to claim 1, comprising determining a selected angular span of illumination that once applied results in a the different diffraction orders interact with different spatially separated regions on a radiation sensitive surface of a detector.

9. The method according to claim 8, comprising performing one or more measurement sessions on the patterned structure using the selected angular span of illumination.

10. The method according to claim 1 wherein the deducing of the deduced background signals comprises deducing the background signals over an entire image acquired by a radiation sensitive surface of a detector.

11. The method of claim 1, further comprising applying model based fitting procedure to the effective measured signals and determining one or more parameters of the patterned structure.

12. A control unit comprising: data input and output utilities, a memory utility, and a processor utility, said processor utility being configured and operable to process data indicative of measured signals corresponding to detected radiation response of a patterned structure to incident X-ray radiation wherein the measured signals comprise (a) an angular span of diffraction orders that were scattered from the patterned structure, and (b) background signals; processor utility being configured and operable to deduce background signals within the angular span, based on background signals located outside the angular span; and apply a filtering procedure to the measured signals to subtract from measured signals within the angular span, the deduced background signals within the angular span to provide effective measured signals that are, within the angular span, substantially free of the background signals.

13. The control unit according to claim 12, further comprising: a measurement scheme controller, which is configured and operable to determine a selected angular span of illumination that once applied results in a having radiation components of different reflection orders interact with different spatially separated regions on a radiation sensitive surface of a detector.

14. The control unit according to claim 12 wherein the processor utility being configured and operable to deduce the deduced background signals within the angular span by expanding the background signals outside of the angular span.

15. The control unit according to claim 12 wherein the processor utility being configured and operable to deduce the deduced background signals within the angular span by interpolating the background signals outside of the angular span.

16. A measurement system for use in X-ray based measurements on patterned structures, the system comprising: an illumination unit configured and operable to define an illumination channel for directing illuminating radiation onto a measurement plane for interacting with a structure being measured; an angular span controller located in the illumination channel; a detection unit for detecting radiation response from the structure propagating along a collection channel; and a control unit configured for data communication with the illumination and detection units, the control unit comprising a measurement scheme controller, which is configured and operable to analyze data indicative of a pattern on the structure being measured, and generate measurement scheme data indicative of selected angular span $\theta_{ILL}$ of illuminating radiation and azimuth orientation $\phi_{ILL}$ with respect to the pattern to provide an angular span $\phi_{COL}$ of reflection orders in the radiation response of the structure such that radiation components of different reflection orders interact with different spatially separated regions on a radiation sensitive surface of the detector;

wherein said control unit comprises data input and output utilities, a memory utility, and a processor utility, the processor utility being configured and operable to process data indicative of measured signals corresponding to detected radiation response of a patterned structure to incident X-ray radiation, wherein the measured signals comprise (a) an angular span of diffraction orders that were scattered from the patterned structure, and (b) background signals; wherein the processor utility being configured and operable to deduce background signals within the angular span, based on background signals located outside the angular span; and apply a filtering procedure to the measured signals to subtract from measured signals within the angular span, the deduced background signals within the angular span to provide effective measured signals that are, within the angular span, substantially free of the background signals.

17. The system according to claim 16, wherein said angular span controller comprises an aperture assembly of controllably varying dimension to enable selection of an aperture dimension according to the selected measurement scheme.

18. The system according to claim 16, The control unit according to claim 12 wherein the processor utility being configured and operable to deduce the deduced background signals within the angular span by extrapolating the background signals outside of the angular span.

19. The system according to claim 16, wherein said angular span controller comprises an aperture assembly of controllably varying shape to enable selection of an aperture shape according to the selected measurement scheme.

20. The system according to claim 17, wherein said angular span controller further comprises an aperture assembly of controllably varying shape to enable selection of an aperture shape according to the selected measurement scheme.

* * * * *